(12) United States Patent
Ito

(10) Patent No.: US 11,494,278 B2
(45) Date of Patent: Nov. 8, 2022

(54) SERVICE SYSTEM AND SERVER

(71) Applicant: FUJI CORPORATION, Chiryu (JP)

(72) Inventor: Mikine Ito, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 842 days.

(21) Appl. No.: 16/462,404

(22) PCT Filed: Dec. 8, 2016

(86) PCT No.: PCT/JP2016/086468
§ 371 (c)(1),
(2) Date: May 20, 2019

(87) PCT Pub. No.: WO2018/105073
PCT Pub. Date: Jun. 14, 2018

(65) Prior Publication Data
US 2019/0303257 A1    Oct. 3, 2019

(51) Int. Cl.
*G06F 11/22*      (2006.01)
*G06F 9/54*       (2006.01)
*H05K 7/14*       (2006.01)
*G05B 19/418*     (2006.01)
*H05K 13/00*      (2006.01)

(52) U.S. Cl.
CPC ........ *G06F 11/2247* (2013.01); *G05B 19/418* (2013.01); *G06F 9/542* (2013.01); *H05K 7/1487* (2013.01); *H05K 7/1489* (2013.01); *H05K 7/1492* (2013.01); *H05K 13/00* (2013.01); *Y02P 90/02* (2015.11)

(58) Field of Classification Search
None
See application file for complete search history.

(56) References Cited

U.S. PATENT DOCUMENTS

| | | | |
|---|---|---|---|
| 6,832,122 | B1 | 12/2004 | Huber |
| 2009/0204251 | A1 | 8/2009 | Maenishi |
| 2015/0206086 | A1 | 7/2015 | Kitayama et al. |

FOREIGN PATENT DOCUMENTS

| | | |
|---|---|---|
| EP | 2 894 528 A1 | 7/2015 |
| JP | 2008-28032 A | 2/2008 |
| WO | WO 02/05343 A2 | 1/2002 |
| WO | WO 2007/119541 A1 | 10/2007 |

OTHER PUBLICATIONS

Extended European Search Report dated Nov. 15, 2019, in Patent Application No. 16923293.1, 11 pages.
International Search Report dated Mar. 14, 2017 in PCT/JP2016/086468 filed on Dec. 8, 2016.

*Primary Examiner* — Syed A Roni
(74) *Attorney, Agent, or Firm* — Oblon, McClelland, Maier & Neustadt, L.L.P.

(57) ABSTRACT

A service system and a server capable of increasing an operation rate of a production base are provided. The server acquires operation information of a component mounter in a mounting work from a host computer in the production base. The server generates analyzed result data obtained by analyzing the operation information based on the types of the manufacturers (component manufacturer and the package manufacturer) of electronic component and the package. The server transmits the generated analyzed result data to host computers in the other production bases.

9 Claims, 9 Drawing Sheets

FIG. 7

Error information

| Error occurrence date and time | Production line info | Module ID | Slot number | Error content | Mounting work conditions |
|---|---|---|---|---|---|
| 2016 Oct 1 1:04:05 | A | MCR004YY | S 1 | No pickup | Mounting speed, nozzle diameter, pickup offset, etc. |

FIG. 8

Operation information

| Component model number | Device model number | Error content | Error details | Error location | Production board type | Mounting work conditions | Error rate |
|---|---|---|---|---|---|---|---|
| MCR004YY | N X 0 0 1 | No pickup | Peeling failure | Package manufacturer etc. | XY01A | Mounting speed, nozzle diameter, pickup offset, etc. | 98% |

| Component model number | Package manufacturer | Component manufacturer | Error occurrence rate |
|---|---|---|---|
| MCR004YY | A1 package company | B1 component company | 80% |
| MCR004YY | A1 package company | B2 component company | 98% |
| MCR004YY | A2 package company | B1 component company | 90% |
|  |  |  |  |

⋮

SERVICE SYSTEM AND SERVER

TECHNICAL FIELD

The present application relates to a service system and a server for acquiring operation information from component mounters provided in multiple production bases and providing services based on the acquired operation information to the production bases and the like.

BACKGROUND ART

Circuit board manufacturers select and use electronic components, carrier tapes accommodating electronic components, and the like used in component mounters installed at production bases from products of multiple manufacturers. Since the multiple products are different in quality, an operation rate of the component mounter varies depending on the products used. For example, Patent Literature 1 discloses a service supply method with providing a measure to a production base in a case where a cause of decreasing an operation rate of a component mounter resides in an electronic component purchased from a component manufacturer.

PATENT LITERATURES

Patent Literature 1: JP-A-2008-28032

BRIEF SUMMARY

Technical Problem

In the above service supply method, information is acquired from a certain production base, and how to perform countermeasures is fed back to the production based on the information acquired from the production base. However, the above-described problem of the operation rate is also likely to occur in the same manner at multiple production bases, and thus, further improvement is required in the way such a service is provided.

The present disclosure has been made in view of the above-described problems, and an object thereof is to provide a service system and a server capable of increasing an operation rate of a production base.

Solution to Problem

According to the present description, a service system includes a first data processing section provided in a first production base, a second data processing section provided in a second production base located differently from the first production base, and a server connected to the first data processing section and the second data processing section; a component mounter for mounting an electronic component on a board is provided in each of the first production base and the second production base, the component mounter includes a supply device configured to supply the electronic component from an accommodation member in which electronic components are accommodated, and performs a mounting work of mounting the electronic component supplied from the supply device on the board is performed; and the server acquires operation information of the component mounter, being obtained in the mounting work, from the first data processing section, generates analyzed result data obtained by analyzing the operation information based on a type of a manufacturer of at least one of the electronic components and the accommodation member, and transmits the generated analyzed result data to the second data processing section.

According to the present description, a server is connected to a first data processing section provided in a first production base and a second data processing section provided in a second production base different from the first production base; a component mounter for mounting an electronic component on a board is provided in each of the first production base and the second production base is provided; the component mounter includes a supply device configured to supply the electronic component from an accommodation member in which electronic components are accommodated, and performs a mounting work of mounting the electronic component supplied from the supply device on the board is performed; and the server acquires operation information of the component mounter in the mounting work from the first data processing section, generates analyzed result data obtained by analyzing the operation information based on a type of a manufacturer of at least one of the electronic components and the accommodation member, and transmits the generated analyzed result data to the second data processing section.

Advantageous Effects

According to the configuration, the server provides the analyzed result data generated from the operation information acquired from the first production base to the second data processing section in the second production base which is another production base. The analyzed result data is data obtained by analyzing the operation information based on the type of the manufacturer of the electronic component and the accommodation member. Thus, the second data processing section in the second production base can notify the producer (operator, production planner, and the like) of the electronic component and the accommodation member (manufacturer) that allows the operation rate of the component mounter in the mounting work to further increase, based on the information (analyzed result data) of the other production base (first production base).

BRIEF DESCRIPTION OF DRAWINGS

FIG. 7 is a diagram illustrating a data configuration of error information.

FIG. 8 is a diagram illustrating a data configuration of operation information.

DESCRIPTION OF EMBODIMENTS

Hereinafter, an embodiment of a service system according to the present application will be described with reference to the drawings. Note that each drawing used in the description is a conceptual drawing, and the shape of each part may not necessarily be strict.

1. Configuration of Service System 10

Figure 1:
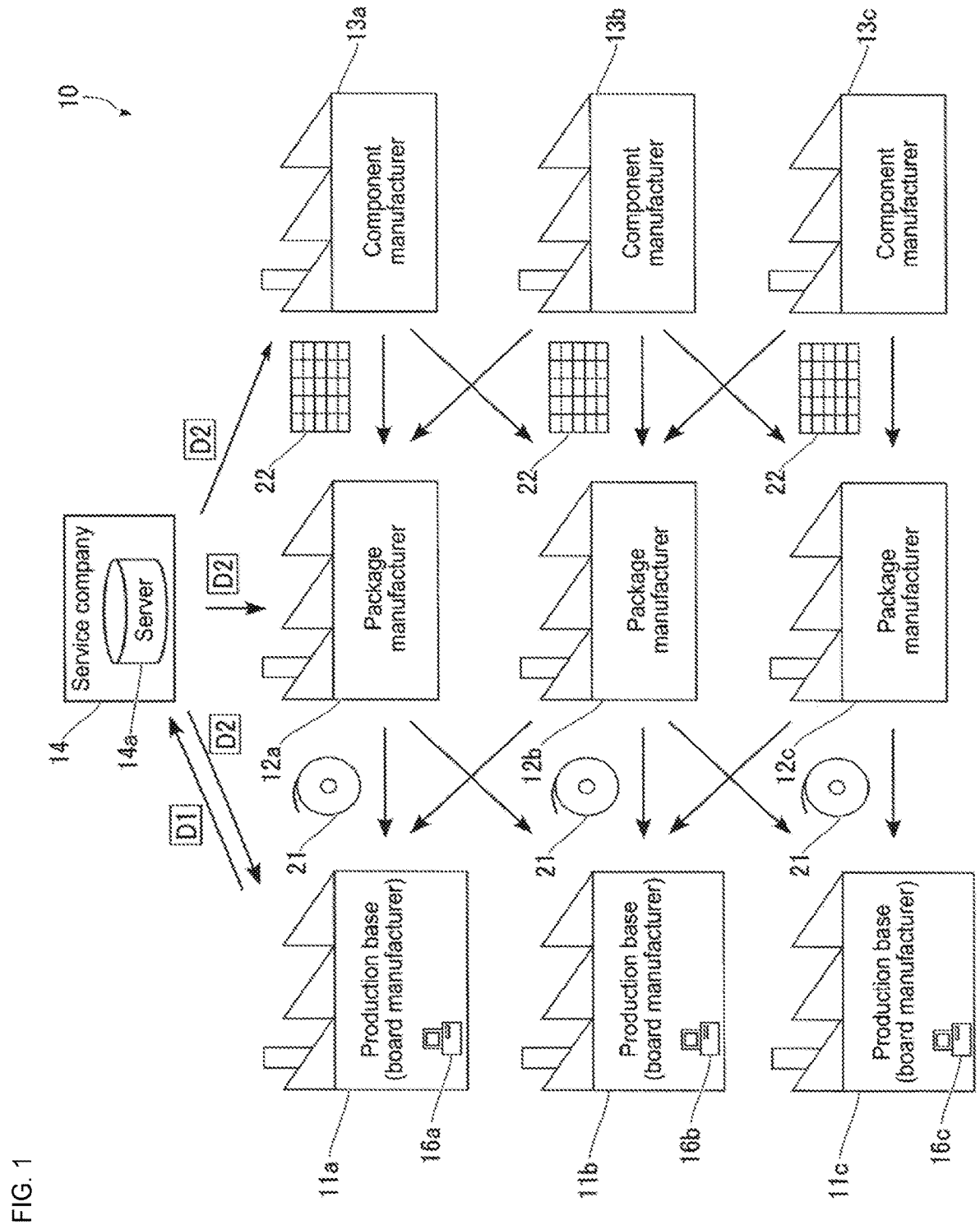
FIG. 1 is a schematic diagram illustrating a relationship between bases to which a service system according to an embodiment of the present application is applied.

FIG. 1 illustrates bases to which service system 10 in the present application is applied and a relationship between the bases. As illustrated in FIG. 1, as an example, production bases 11a, 11b, and 11c of three board manufacturers, three package manufacturers 12a, 12b, and 12c that supply packages 21 to production bases 11a to 11c, component manufacturers 13a, 13b, and 13c that supply electronic components 22 to package manufacturers 12a to 12c, and service company 14 that provides information on the quality of packages 21 and electronic components 22 to production base 11a and the like are connected to a network of service system 10.

Production bases 11a to 11c are manufacturing plants or the like of different board manufacturers. In production bases 11a to 11c, production lines for producing boards are constructed. The production lines are managed by host computers 16a, 16b, and 16c in production bases 11a to 11c, for example. Each of host computers 16a to 16c (examples of a first host computer and a second host computer) collects operation information D1 regarding an operation state of a component mounter from the production line, and provides collected operation information D1 to server 14a of service company 14.

Server 14a analyzes operation information D1 collected from host computers 16a to 16c, and generates analyzed result data D2. Server 14a transmits analyzed result data D2 in response to an inquiry from host computers 16a to 16c. Server 14a notifies the corresponding manufacturer of analyzed result data D2. Details will be described later.

Each of component manufacturers 13a to 13c supplies electronic component 22 to any of package manufacturers 12a to 12c. Similarly, each of package manufacturers 12a to 12c supplies package 21 to any of production bases 11a to 11c. A delivery source and a delivery destination of electronic component 22 or package 21 are appropriately changed by contracts between the manufacturers. In the embodiment, descriptions will be made on the assumption that package manufacturers 12a to 12c are different from component manufacturers 13a to 13c, but, one manufacturer may collectively perform processes from manufacturing of electronic component 22 to manufacturing of package 21.

2. Regarding Production Base 11a to 11c

Next, a configuration of each of production bases 11a to 11c will be described. The configuration of each of production bases 11a to 11c is different for each manufacturer. Therefore, in the following descriptions, an example of the configuration of production base 11a will be described.

Figure 2:
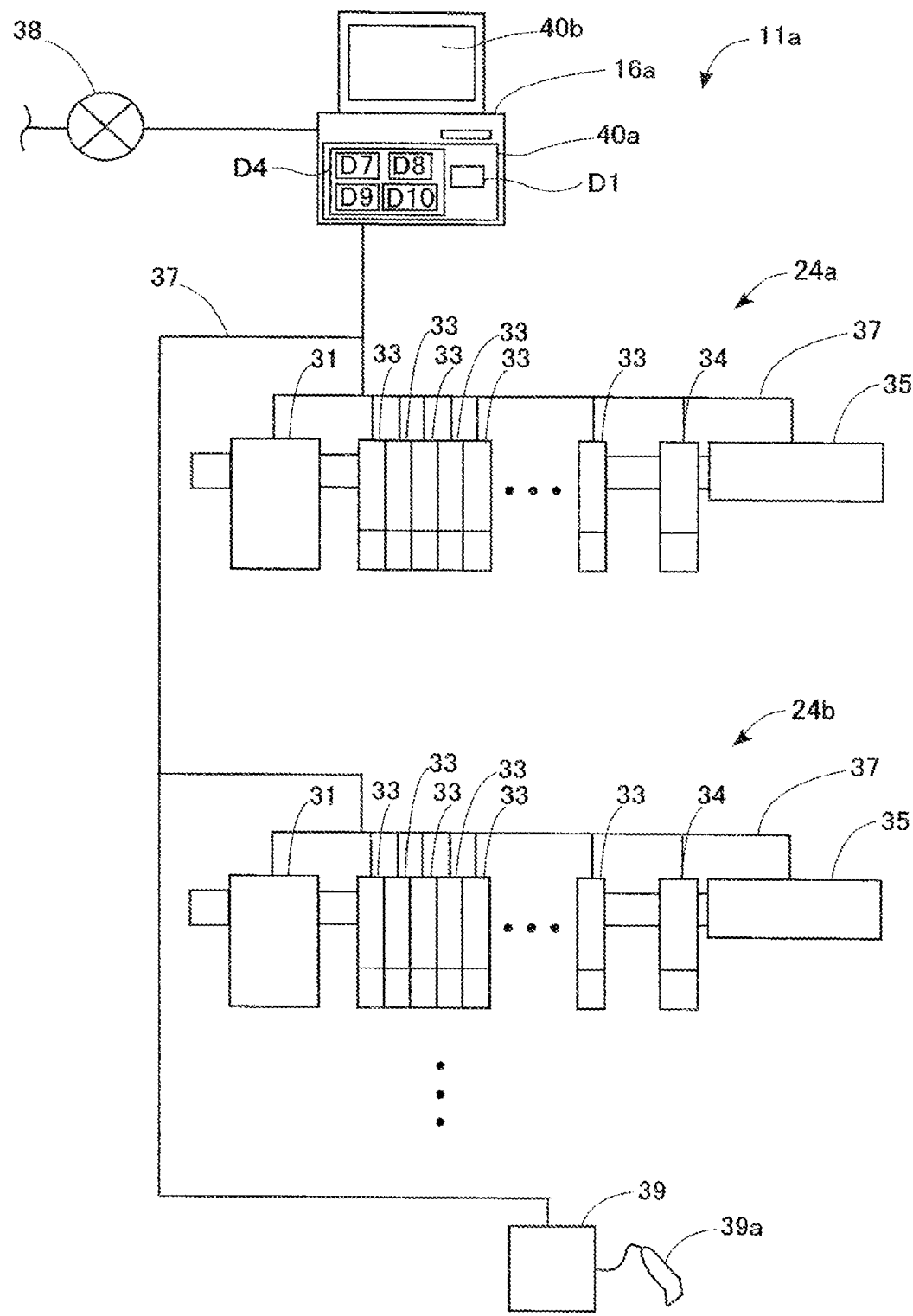
FIG. 2 is a schematic diagram illustrating a configuration of a host computer and a production line installed in a production base.

As illustrated in FIG. 2, in production base 11a, a system in which a component is mounted on a board in a manner that the board is conveyed, and multiple works, that is, solder printing, component mounting, reflow, and the like are sequentially performed is constructed. Host computer 16a in production base 11a manages multiple production lines (FIG. 2 illustrates only two production lines 24a and 24b). Since production lines 24a and 24b have the same configuration, in the following descriptions, production line 24a will be mainly described, and the descriptions of other production lines 24b and the like will be omitted as appropriate.

In the embodiment, in production line 24a, solder printing device 31, multiple component mounters 33, mounting inspection device 34, reflow device 35, and the like are joined and arranged in this order from the upstream side to the downstream side. Devices 31 to 35 and the like constituting production line 24a are connected to each other via communication network 37 so as to be able to be collectively controlled by host computer 16a.

Solder printing device 31 is configured to be capable of performing solder printing for component bonding on a board carried in from the upstream side. Multiple component mounters 33 are configured to enable mounting of an electronic component on the board after solder printing by solder printing device 31. Mounting inspection device 34 is configured to inspect the board on which the electronic component has been mounted by component mounter 33, and to be able to determine a defective board. Reflow device 35 is configured to enable solder bonding of the electronic component to the board by heating the board on which mounting inspection device 34 determines that mounting has been favorably performed, at a predetermined temperature so as to melt and then solidify solder paste printed on the board.

For example, one host computer 16a is provided for multiple production lines 24a and 24b, and collectively manages multiple production lines 24a and 24b. Host computer 16a may be disposed in each of production lines 24a and 24b.

Host computer 16a mainly includes CPU, various memories, and a control circuit, and includes storage device 40a. Storage device 40a is configured by, for example, an optical drive device such as a hard disk device, a flash memory, or the like. Storage device 40a stores, for example, job data D4 in addition to above-described operation information D1. Job data D4 is data in which, for example, a wiring pattern to be printed on a board by solder printing device 31, a position and an order of an electronic component to be mounted on the board by component mounter 33, a production plan indicating the number of boards to be produced are set. Host computer 16a is configured to read and execute job data D4 and the like from storage device 40a, and thus to be capable of collectively controlling devices 31 to 35 and the like.

Host computer 16a transmits data generated from job data D4 (such as recipe data) to solder printing device 31 and component mounter 33 via communication network 37. Solder printing device 31 prints the wiring pattern in accordance with the received data. Component mounter 33 mounts the electronic component on the board in accordance with the received data.

Host computer 16a is connected to server 14a (see FIG. 1) of service company 14 via wide area network 38. Wide area network 38 is, for example, the Internet network. Host computer 16a transmits operation information D1 to server 14a via wide area network 38.

Storage location side device 39 is provided in production base 11a. Storage location side device 39 is provided in tape feeder 45 (see FIG. 4) for replenishment or a storage container (not illustrated) configured to store package 21. Storage location side device 39 assigns, for example, component code 55 (see FIG. 4) in which new package 21 delivered to the storage container is associated with the model number of the electronic component, component manufacturers 13a to 13c, package manufacturers 12a to 12c, and the like. Component code 55 is, for example, a bar code. Storage location side device 39 transmits the associated information to host computer 16a via communication network 37. Thus, host computer 16a can determine component manufacturers 13a to 13c and package manufacturers 12a to 12c based on component code 55. Storage location side device 39 includes bar code reader 39a configured to detect component code 55. For example, when the operator takes out package 21 for replenishment from the storage container, the operator causes bar code reader 39a to read component code 55 of taken package 21. Storage location side device 39 transmits component code 55 of package 21 taken out from the storage container via communication network 37. Thus, host computer 16a can manage the incoming and outgoing of packages 21 from the storage container. In addition, such storage management may be performed in a manner that a tag such as an RFID is provided on a package, and a component code is read by antennas provided at the entrances of the storage container.

3. Configuration of Component Mounter 33

Figure 3:
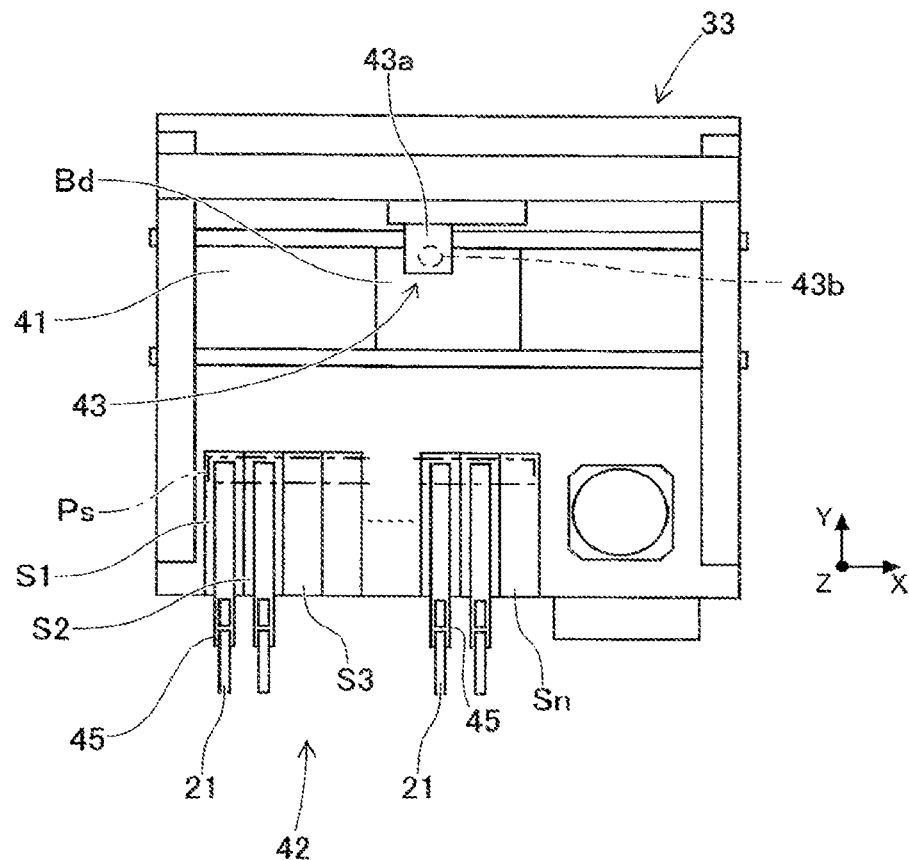
FIG. 3 is a plan view illustrating a component mounter.

Next, the configuration of component mounter 33 will be described. As illustrated in FIG. 3, component mounter 33 includes board conveyance device 41, component supply device 42, and component transfer device 43. In the following description, a horizontal width direction (left-right direction in FIG. 3) of component mounter 33 is set as an X-axis direction, a horizontal depth direction (up-down direction in FIG. 3) of component mounter 33 is set as a Y-axis direction, and a direction perpendicular to the X-axis direction and the Y-axis direction is set as a Z-axis direction.

Board conveyance device 41 is configured by a belt conveyor or the like, and conveys the circuit boards Bd sequentially in a conveyance direction (in the present embodiment, the X-axis direction). Component supply device 42 supplies electronic component 22 (see FIG. 1) mounted on board Bd to supply position Ps. Component supply device 42 has multiple slots S1, S2, S3, . . . , and Sn arranged side by side in the X-axis direction. Tape feeder 45 is detachably mounted in each of multiple slots S1 to Sn. Further, slot numbers for identifying each other are set in multiple slots S1 to Sn. Component supply device 42 feeds and moves carrier tape 46 (see FIG. 4) by tape feeder 45, and supplies electronic component 22 to supply position Ps located on the tip end side (upper side in FIG. 3, left side in FIG. 4) of tape feeder 45.

Mounting head 43a of component transfer device 43 is configured to be movable in the X-axis direction and the Y-axis direction. Multiple suction nozzles 43b are detachably provided on mounting head 43a. Each suction nozzle 43b picks up and holds electronic component 22 supplied to supply position Ps of tape feeder 45 by being supplied with a negative pressure. Component mounter 33 performs a mounting work of moving mounting head 43a and suction nozzle 43b or the like to mount electronic component 22 on board Bd.

3-1. Configuration of Tape Feeder 45

Figure 4:
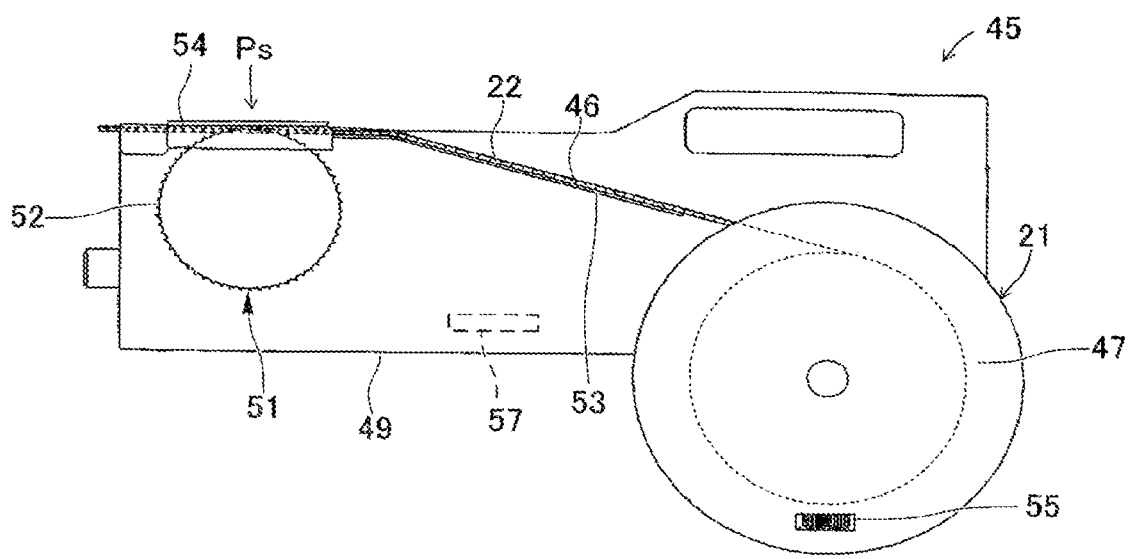
FIG. 4 is a side view illustrating a tape feeder.

As illustrated in FIG. 4, tape feeder 45 is loaded with package 21 in which carrier tape 46 is wound around reel 47. Carrier tape 46 accommodates electronic component 22 at a predetermined pitch. Carrier tape 46 has a base tape having an accommodation section for accommodating electronic component 22, and a cover tape that is attached to the base tape and closes the accommodation section. Package 21 is held by reel 47 by feeder main body 49 of tape feeder 45, and is detachably attached to tape feeder 45.

Tape feeder 45 incorporates constant feeding mechanism 51. Constant feeding mechanism 51 includes sprocket 52 which is rotatably supported by feeder main body 49 and engaged with a feeding hole (not illustrated) of carrier tape 46, and a motor (not illustrated) for rotating sprocket 52 pitch by pitch. Rail 53 of tape feeder 45 supports carrier tape 46 fed from reel 47 from below to constitute a conveyance path. Sprocket 52 is disposed below rail 53, and engages a tooth (protruding portion) on the outer periphery of the feeding hole of carrier tape 46 to draw carrier tape 46 on rail 53 into the supply position Ps.

Peeling section 54 configured to peel a cover tape off from a base tape of carrier tape 46 is provided at supply position Ps. As carrier tape 46 is conveyed, peeling section 54 causes a cutter to intervene between the base tape and the cover tape to peel the cover tape from the base tape. As a result, the accommodation section is opened, and electronic component 22 can be picked up with suction by suction nozzle 43b at supply position Ps.

Component code 55 is identification information for identifying package 21. Component code 55 is read by a splicing device (not illustrated), for example, when tape feeder 45 in component shortage is replenished (spliced). The splicing device transmits the information of spliced component code 55 to host computer 16a by wireless communication or the like. As a result, host computer 16a can manage production lines 24a and 24b, the module ID of component mounter 33, the numbers of slots S1 to Sn, and component code 55 in association with each other.

Feeder ID 57 is identification information for identifying tape feeder 45. Feeder ID 57 is read, for example, when tape feeder 45 is mounted in slots S1 to Sn, and is transmitted from component mounter 33 to host computer 16a. As a result, host computer 16a can manage feeder ID 57 in association with production lines 24a and 24b, the module IDs of component mounters 33, the numbers of slots S1 to Sn, and component codes 55.

4. Job Data D4

Next, the details of job data D4 will be described. As illustrated in FIG. 2, job data D4 includes component data D7, board data D8, device data D9, recipe data D10, and the like as data relating to component mounter 33.

Component data D7 includes information on electronic component 22 that may be mounted on board Bd. In component data D7, for example, in addition to shape information such as the external dimensions of electronic component 22 and the arrangement of the connection terminals, information such as component code 55, the model numbers of component manufacturers 13a to 13c, component manufacturers 13a to 13c, and package manufacturers 12a to 12c is associated.

Component data D7 includes, for example, information on a mounting rate, a nozzle diameter, a pickup offset, and the like as information on conditions for performing a mounting work on board Bd. Here, the mounting rate is, for example, information such as the number of electronic components 22 that can be mounted on board Bd per unit time, the value of the speed at which mounting head 43a is moved in the horizontal direction, the value of the speed at which suction nozzle 43b is moved in the Z-axis direction, or the like. The nozzle diameter is, for example, the outer diameter of the nozzle portion of suction nozzle 43b. The pickup offset is, for example, a value for correcting the position where electronic component 22 is picked up by suction nozzle 43b in accordance with the type (shape, etc.) of electronic component 22. The above-described condition (mounting work condition) is just an example and may be changed as appropriate.

Board data D8 includes information such as the external shape of board Bd to be produced, the arrangement of the circuit pattern, the mounting position of electronic component 22, the position of various markers, and the like. Device data D9 includes information on the performance of component mounter 33 and the like. Device data D9 includes, for example, data indicating in which slots S1 to Sn (see FIG. 3) of which component mounters 33 of production lines 24a and 24b the tape feeders 45 and packages 21 are arranged. Device data D9 includes data relating feeder ID 57 of tape feeder 45 mounted on respective component mounters 33 (see FIG. 4), component codes 55 of packages 21 mounted on tape feeder 45, and the model numbers of electronic components 22 of carrier tape 46 wound on reels 47.

Recipe data D10 is data describing a method of producing board Bd of a given board type by component mounter 33, and includes data corresponding to the board type and component mounter 33. Recipe data D10 is generated, for example, every time board Bd of a new board type is produced. Recipe data D10 includes information on the order in which the multiple electronic components 22 are mounted on board Bd, mounting work conditions, positional information of slots S1 to Sn of tape feeder 45, and the like.

5. Operation of Host Computers 16a to 16c

Next, the operation of host computer 16a will be described with reference to FIGS. 5 to 8. Since the operations of the other host computers 16b and 16c are the same as those of host computer 16a, the description thereof is omitted as appropriate.

Figure 6:
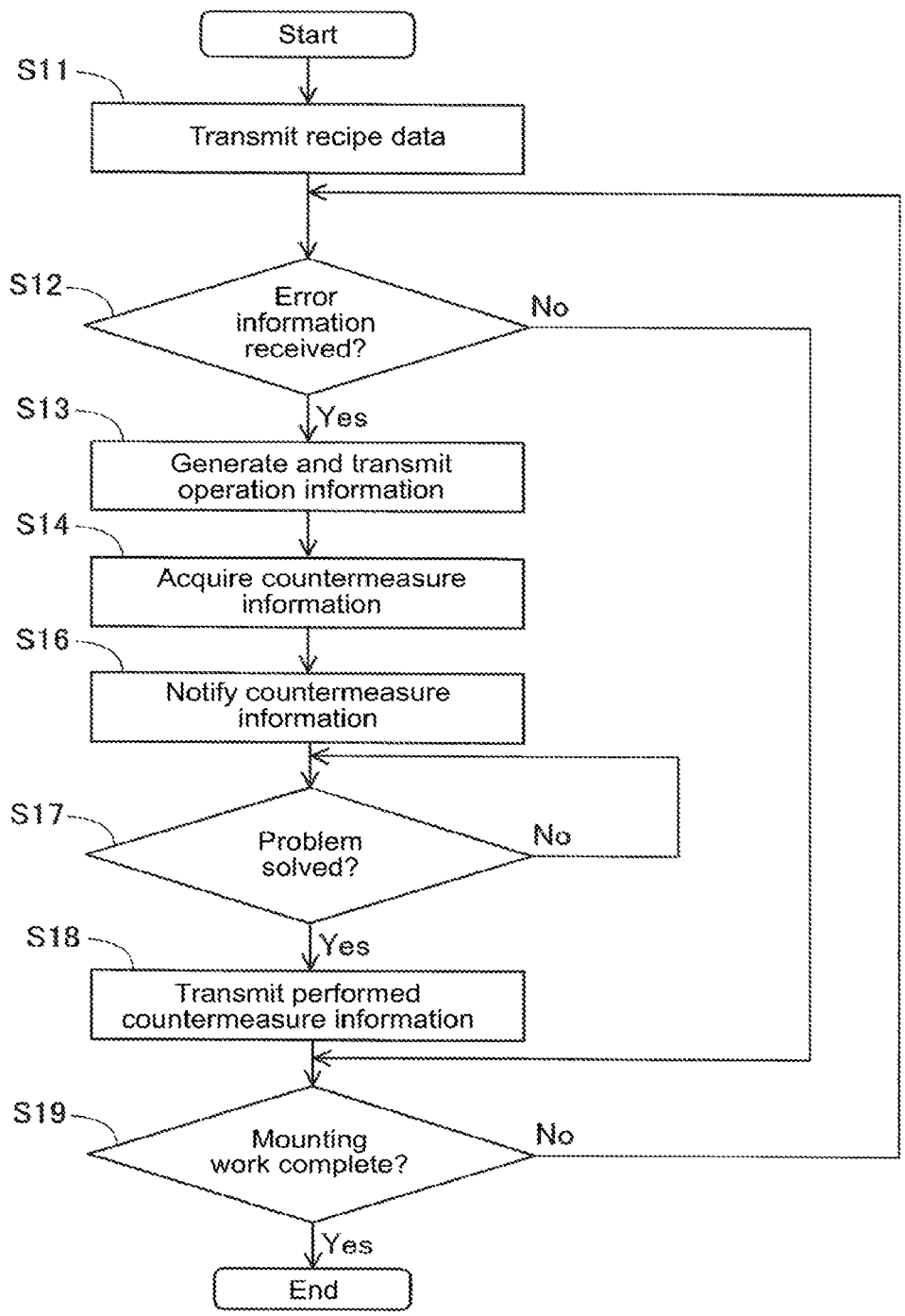
FIG. 6 is a flowchart illustrating details of processing of the host computer.

Host computer 16a starts processing illustrated in FIG. 6, for example, when the production of board Bd of a new board type is started. First, host computer 16a transmits recipe data D10 necessary for the production of next board Bd to each of component mounters 33 in production lines 24a and 24b in the step (hereinafter, simply referred to as "S") 11 illustrated in FIG. 6. When each component mounter 33 receives recipe data D10 via communication network 37 (see FIG. 2), the mounting work of board Bd starts based on recipe data D10.

When an error occurs during the mounting work, each of component mounters 33 transmits error information D11 (see FIG. 5) to host computer 16a. FIG. 7 illustrates an example of the data configuration of error information D11, and illustrates, for example, a case where an error occurs in which electronic component 22 cannot be picked up from supply position Ps (see FIG. 4) of tape feeder 45 by suction.

As illustrated in FIG. 7, error information D11 includes an error occurrence date and time, production line information, a module ID, a slot number, an error content (without suction pickup), and information on mounting work conditions. The error occurrence date and time is the date and time when an error occurred in component mounter 33. The production line information is identification information of production lines 24a and 24b in which component mounter 33 in which an error has occurred is disposed. The module ID is identification information for identifying component mounter 33 disposed along production lines 24a and 24b. The slot numbers are the numbers of slots S1 to Sn in which tape feeder 45 in which the suction pickup error has occurred is mounted.

The mounting work condition includes information such as a mounting rate, a nozzle diameter, and a pickup offset included in above-described component data D7. For example, the nozzle diameter is the outer diameter of suction nozzle 43b used at the time of occurrence of an error. The mounting work condition is set by recipe data D10 or the like before the production of board Bd is started, and is managed by host computer 16a. For this reason, component mounter 33 may be set to transmit the mounting work condition only when the mounting work is changed or the like after the mounting work is started. Error information D11 illustrated in FIG. 7 is appropriately changed depending on the content of the error that has occurred.

The mounting work condition is data required when server 14a described later generates analyzed result data D2. Analyzed result data D2 is used when host computers 16a to 16c generate recipe data D10. For this reason, the mounting work condition includes identification information (feeder ID 57 and the like) of suction nozzles 43b or tape feeder 45 in the process of being used, in addition to the above-described mounting rate and the like.

Returning to FIG. 6, after executing the transmission of recipe data D10 (S11), host computer 16a determines whether error information D11 has been received from each of component mounters 33 (S12). If error information D11 has not been received (S12: NO), host computer 16a executes the processing of S19 and subsequent steps (described later).

On the other hand, when host computer 16a receives error information D11 from any one of component mounters 33 disposed in production base 11a (S12: YES), host computer 16a generates operation information D1 for transmission to server 14a of service company 14 (see FIG. 1) based on error information D11 (S13).

FIG. 8 illustrates an example of operation information D1. As illustrated in FIG. 8, operation information D1 includes information on a component model number, a device model number, an error content, error details, an error place, a production board type, a mounting work condition, and an error occurrence rate. The component model number is a model number of component manufacturers 13a to 13c of electronic component 22 for which the suction pickup error has occurred. The device model number is the model number of component mounter 33 for which an error has occurred. The error details are detailed information on the error, and are input by a producer (operator, production planner, and the like) operating host computer 16a, for example. After an error occurs in component mounter 33, the producer investigates the cause and inputs the result using host computer 16a. As an example, peeling-off failure is entered in the column of the error details in FIG. 8. In this case, it is illustrated that the failure of the peeling of the cover tape of carrier tape 46 was the cause in peeling section 54 (see FIG. 4) of tape feeder 45. It should be noted that host computer 16a may appropriately input the contents of the error which can be automatically determined and input.

The error place is information or the like for identifying a member which is considered to cause an error. For example, the above-described peeling-off failure involves package manufacturers 12a to 12c that package electronic components 22. Therefore, identification information (manufacturer name, etc.) of package manufacturers 12a to 12c of package 21 for which the peeling-off failure has occurred is set in the column of the error place. For example, regarding the information in the error place, host computer 16a may determine and set necessary information based on the content of the error or the details of the error. Alternatively, the producer may use host computer 16a to input the information of the error place. In addition, since tape feeder 45 is also supposed to be a cause of the peeling-off failure, the identification information (model number, etc.) of tape feeder 45 may be set in the column of the error place in addition to the identification information of package manufacturers 12a to 12c.

Further, for example, when an error occurs in which electronic component 22 cannot be properly picked up with suction by suction nozzle 43b as another error, the identification information of component manufacturers 13a to 13c, the identification information of suction nozzle 43b, the identification information of mounting head 43a, and the like may be set in the error place. Further, for example, when the shape of electronic component 22 picked up by suction nozzle 43b cannot be appropriately recognized by image processing or the like as another error, the identification information of component manufacturers 13a to 13c may be set in the error place. Host computer 16a can acquire the above-described various information (component model number, device model number, and the like) by referring to job data D4 (see FIG. 2) stored in storage device 40a.

The production board type of operation information D1 illustrated in FIG. 8 is information on the type of board Bd that was produced when an error occurred. The error occurrence rate indicates, for example, the error occurrence rate when an error occurs. For example, component mounter 33 acquires information such as the number of electronic components 22 that can be supplied from mounted tape feeder 45 and the number of electronic components 22 supplied (used) along with identification information (feeder ID 57 or component codes 55 illustrated in FIG. 4) of tape feeder 45 and packages 21, and transmits the information to host computer 16a. Host computer 16a manages the information received from component mounter 33 for each of the tape feeders 45 and packages 21 in association with feeder ID 57 or the like, and calculates the time at which the component shortage occurs in each of the tape feeders 45. As a result, host computer 16a can manage the remaining number of electronic components 22 of each tape feeder 45, the reduction rate of electronic components 22, and the like. When error information D11 is received from component mounter 33, for example, host computer 16a calculates the error occurrence rate based on the number of use of electronic component 22 and the number of error occurrences based on the remaining number of electronic components 22. For example, host computer 16a calculates the error occurrence rate by dividing "1" by the number of electronic components 22 used from the previous error occurrence.

Host computer 16a transmits the generated operation information D1 to server 14a of service company 14 (S13). Host computer 16a may not transmit operation information D1 every time an error occurs, but may calculate an error occurrence rate or the like when the production of one type of board Bd ends, and transmit operation information D1 to server 14a. At this time, host computer 16a may transmit operation information D1 indicating that the error occurrence rate is "0" to server 14a even for tape feeder 45 or the like in which no error has occurred. As a result, server 14a can acquire information about component manufacturers 13a to 13c and package manufacturers 12a to 12c that have experienced no error.

Next, host computer 16a acquires countermeasure information D12 (see FIG. 5) corresponding to the content of the generated error (error information D11) from server 14a (S14). Countermeasure information D12 is information related to countermeasures for improving the error occurrence rate. Details of countermeasure information D12 will be described later.

Next, host computer 16a notifies the producer of the acquired countermeasure information D12 (S16). For example, host computer 16a displays the content of countermeasure information D12 on display device 40b (see FIG. 2) (S16). When countermeasure information D12 corresponding to multiple error occurrence events is collectively acquired, host computer 16a may display the information in display device 40b in order of the high error occurrence rate. Thus, by checking the display of display device 40b, the producer can solve the problem with a high error occurrence rate preferentially and efficiently.

Next, host computer 16a determines whether a message indicating that the problem related to the error has been solved, for example, the error occurrence rate is improved by implementing the countermeasure, is input from the producer (S17). Host computer 16a repeatedly executes the determination of S17 until an input is received from the producer (S17: NO). For example, when the producer executes a countermeasure according to the content displayed on display device 40b and the error occurrence rate is improved, the producer inputs the fact to host computer 16a. Further, for example, when the producer has improved by implementing a measure different from the displayed content, the producer inputs the implemented condition (the mounting work condition illustrated in FIGS. 7 and 8 and the like) to host computer 16a. As a result, host computer 16a can acquire information that has been improved against the occurrence of an error, that is, countermeasure information D12.

Therefore, when host computer 16a receives an input from the producer (S17: YES), host computer 16a transmits the received countermeasure information D12 (mounting work conditions and the like) to server 14a in association with the content of the improved error (details of the error, component manufacturers 13a to 13c in which the error occurred, package manufacturers 12a to 12c in which the error occurred, and the like) (S18). As a result, server 14a can appropriately acquire countermeasure information D12 having a track record from host computers 16a to 16c of production bases 11a to 11c. Then, as described in S15 and S16, countermeasure information D12 having a record executed in one of production bases 11a to 11c is used when an error occurs in another of production bases 11a to 11c. As a result, each of production bases 11a to 11c can improve the operation rate by using countermeasure information D12 of the other production bases 11a to 11c.

For example, countermeasure information D12 may be information for changing the setting data of component mounter 33, such as recipe data D10. Specifically, it is conceivable to change the setting data, such as decreasing the mounting rate (for example, movement speed of mounting head 43a) or widening the permissible range for determining whether the component is good or bad in image processing of the picked-up electronic component 22.

As countermeasure information D12, for example, information for changing the type of a mounting member (mounting head 43a, suction nozzle 43b, and the like) mounted on component mounter 33 can be considered. More specifically, it is conceivable to change the nozzle diameter of suction nozzle 43b to a size larger than the current size, or to change mounting head 43a to one having a different performance. Host computer 16a associates the setting data and the content of the change in the mounting member with the content of the improved error (for example, component manufacturers 13a to 13c and package manufacturers 12a to 12c) and transmits them to server 14a.

Next, host computer 16a determines whether the mounting work (production of board Bd) in each of production lines 24a and 24b has been completed (S19). Host computer 16a executes the processing from S12 again for production lines 24a and 24b for which the mounting work has not been completed (S19: NO). In addition, host computer 16a ends the processing illustrated in FIG. 6 for production lines 24a and 24b for which the mounting work has been completed (S19: YES). When completing the processing, host computer 16a may transmit operation information D1 indicating that the error occurrence rate is "0" to server 14a for tape feeder 45 or the like in which no error has occurred during production.

6. Operation of Server 14a

Figure 5:
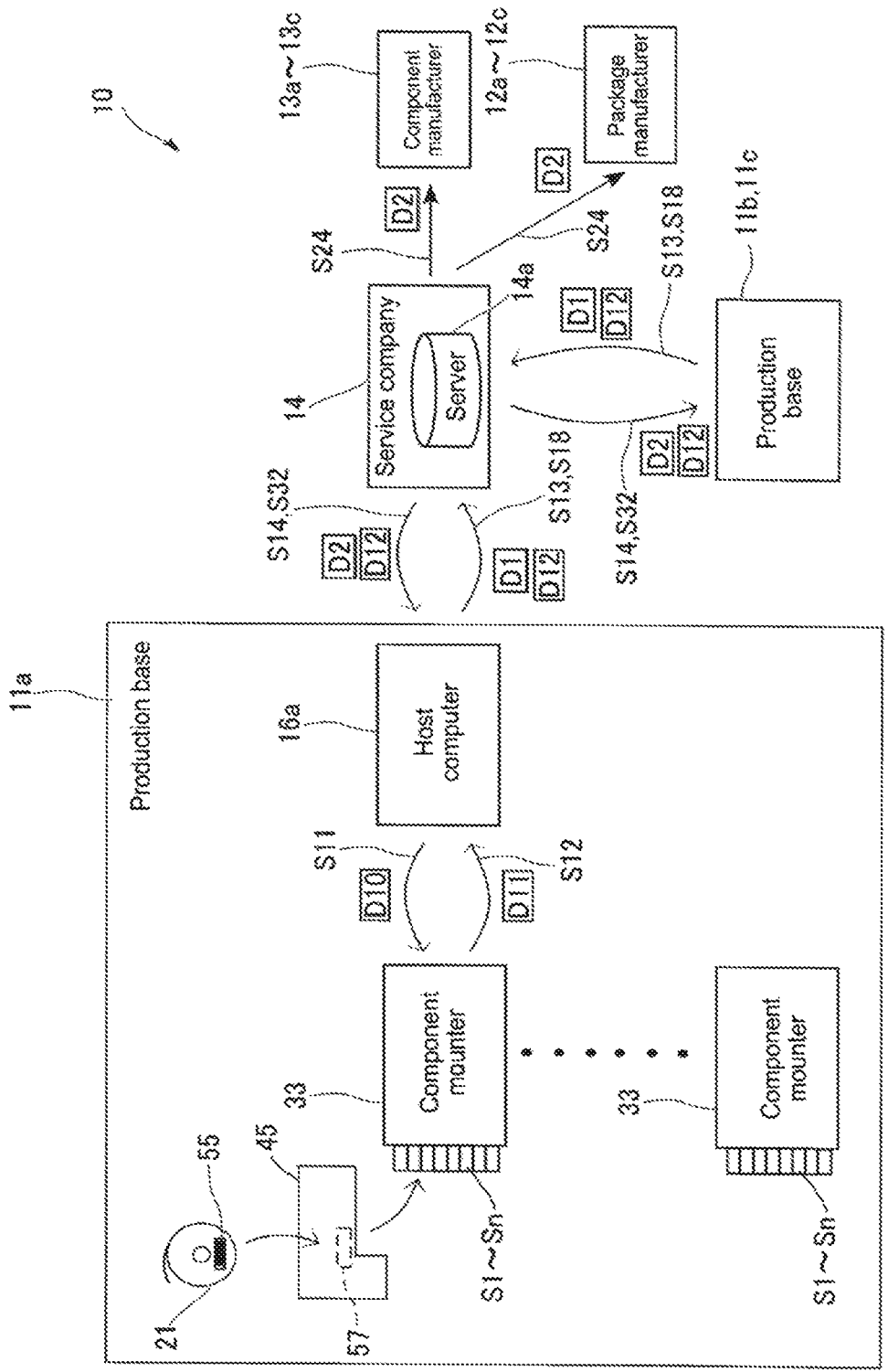
FIG. 5 is a data flow diagram illustrating the service system.
Figure 9:
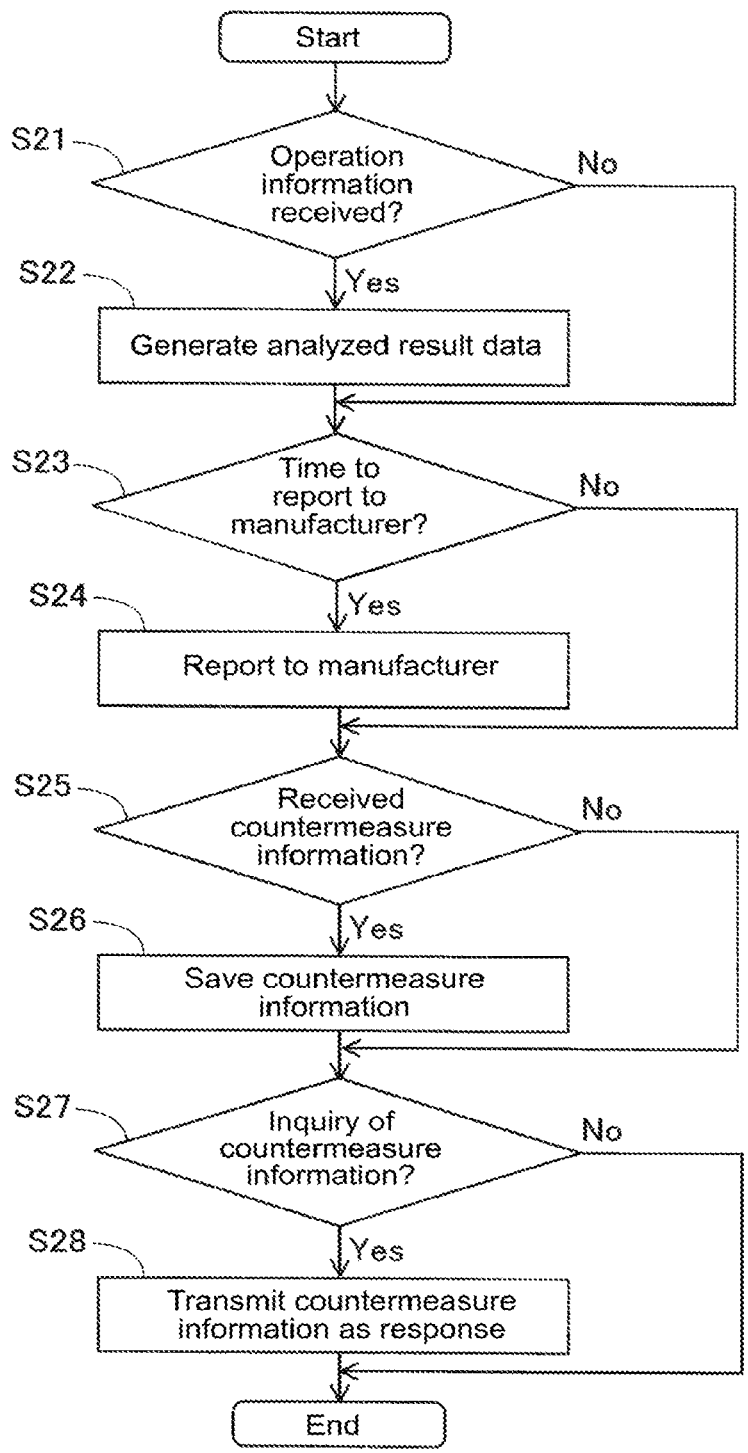
FIG. 9 is a flowchart illustrating details of processing of the server.

Next, the operation of server 14a will be described with reference to FIGS. 5 and 9. FIG. 9 illustrates an example of processing performed by server 14a. Server 14a repeatedly performs the process illustrated in FIG. 9 when the service to each of production bases 11a to 11c, component manufacturers 13a to 13c, and package manufacturers 12a to 12c is started.

First, in S21 illustrated in FIG. 9, server 14a determines whether operation information D1 has been received from each of production bases 11a to 11c. When operation information D1 is received (S21: YES), server 14a generates analyzed result data D2 (S22).

Figures 10, 11:
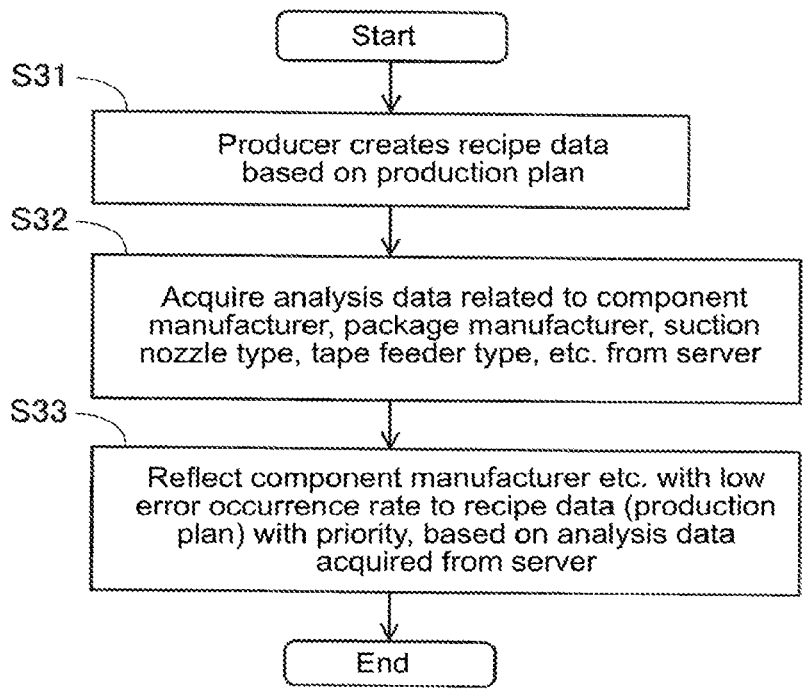
FIG. 10 is a diagram illustrating a data configuration of analyzed result data.
FIG. 11 is a flowchart illustrating details of processing of creating recipe data by the host computer.

FIG. 10 illustrates an example of the data configuration of analyzed result data D2. Server 14a generates analyzed result data D2 based on operation information D1 received from host computers 16a to 16c of production bases 11a to 11c. As illustrated in FIG. 10, server 14a classifies, for example, operation information D1 into groups of component model numbers, package manufacturers 12a to 12c, and component manufacturers 13a to 13c, and calculates an average value of error occurrence rates for each group. As a result, it is possible to acquire the error occurrence rate for each of package manufacturers 12a to 12c and component manufacturers 13a to 13c.

In addition to package manufacturers 12a to 12c, server 14a may calculate the error occurrence rate by grouping operation information D1 based on, for example, feeder ID 57 of tape feeder 45, the identification information of suction nozzles 43b, and the like. As a result, it is possible to acquire records (error occurrence rate) for each type of tape feeder 45 or suction nozzle 43b.

In the example illustrated in FIG. 10, each row represents one group. For example, the data illustrated in the first line indicates the error occurrence rate of package 21 in which electronic component 22 of the component model number "MCR004YY" of the component manufacturer "B1 component company" is packaged by the package manufacturer "A1 package company". The error occurrence rate "80%" is an average value calculated by server 14a by totaling the operation rates (operation information D1) using the same package 21 in each of production bases 11a to 11c. As a result, the error occurrence rate based on the results of production bases 11a to 11c can be obtained. In a case where the component model numbers are not shared, the analyzed result may be generated by adding the shape data and the size data of the component to the data configuration in FIG. 10.

Returning to FIG. 9, after generating analyzed result data D2 in S22, server 14a executes the processing of S23 and subsequent steps. In addition, when operation information D1 is not received in S21 (S21: NO), server 14a executes the process of S23 and later.

In S23, server 14a determines whether it is time to report analyzed result data D2 to each manufacturer. For example, server 14a notifies the corresponding manufacturer (package manufacturers 12a to 12c or component manufacturers 13a to 13c) of the generated analyzed result data D2 (S24). As a result, each manufacturer can improve the quality by grasping the usage record (error occurrence rate) of its own products. For example, in the case of the data on the first line illustrated in FIG. 10, server 14a notifies each of the A1 package company and the B1 component company of the component model number, the manufacturer, the error occurrence rate (in this case, 80%), and the like.

For example, when server 14a determines that it is a preset reporting time (S23: YES), server 14a notifies the manufacturer of the report using e-mail or the like (S24). Server 14a executes the processing of S25 and subsequent steps. When the time is not the reporting time (S23: NO), server 14a executes the processing of S25 and subsequent steps.

Next, server 14a determines whether countermeasure information D12 has been received from each of production bases 11a to 11c (S25). When countermeasure information D12 is received (S25: YES), server 14a saves the received countermeasure information D12 and performs processing after (S26) and S27. In addition, when countermeasure information D12 is not received (S25: NO), server 14a executes the process of S27 or later.

Next, server 14a determines whether there is an inquiry of countermeasure information D12 from host computers 16a to 16c of production bases 11a to 11c (S27). When there is an inquiry (S27: YES), server 14a transmits countermeasure information D12 as a response, to host computers 16a to 16c that have made the inquiry (S28). As described above with reference to S15 to S18 of FIG. 6, server 14a transmits countermeasure information D12 having the record of the improvement of the error occurrence rate and the like in each of production bases 11a to 11c. As a result, each of production bases 11a to 11c can share the effective countermeasure information D12 having a record, and can more reliably improve the operation rate.

After responding to countermeasure information D12, server 14a ends the processing illustrated in FIG. 9. In addition, when there is no query of countermeasure information D12 in S27 (S27: NO), server 14a ends the processing illustrated in FIG. 9. Server 14a periodically and repeatedly executes the processing illustrated in FIG. 9 in this manner, and provides services to production bases 11a to 11c, package manufacturers 12a to 12c, and component manufacturers 13a to 13c, respectively.

7. Generation of Recipe Data D10

Next, generation of recipe data D10 by host computers 16a to 16c will be described with reference to FIG. 11. FIG. 11 illustrates the content of processing for generating recipe data D10 by host computers 16a to 16c. Since the method of generating recipe data D10 in each of host computers 16a to 16c is the same, in the following description, host computer 16a will be described, and the description of the other host computers 16b and 16c will be omitted.

As illustrated in FIG. 11, first, the producer operates host computer 16a to create recipe data D10 of the board type to be produced based on job data D4 (production plan) (S31). When the producer inputs that recipe data D10 has been created, host computer 16a acquires analyzed result data D2 corresponding to the generated recipe data D10 from server 14a (S32). The analytical result data D2 is data corresponding to the types (IDs) of component manufacturers 13a to 13c, package manufacturers 12a to 12c, suction nozzles 43b, the type (feeder ID 57) of tape feeder 45, and the like included in recipe data D10.

Based on analyzed result data D2 acquired from server 14a, host computer 16a selects component manufacturers 13a to 13c, package manufacturers 12a to 12c, suction nozzles 43b, tape feeders 45, and the like with a low error occurrence rate, and preferentially applies the selected component manufacturer to recipe data D10. More specifically, for example, recipe data D10 is changed so as to use electronic component 22 of component manufacturers 13a to 13c and package manufacturers 12a to 12c having a lower error rate even if the electronic components 22 have the same component model number. Further, for example, recipe data D10 is changed so as to use suction nozzle 43b having a lower error occurrence rate among suction nozzles 43b usable for one electronic component 22.

As a result, recipe data D10 in which the error occurrence rate is reduced can be generated. As a result, when component mounter 33 executes the mounting work based on recipe data D10, the error occurrence rate in the mounting work is suppressed. When it is necessary to exchange suction nozzle 43b, tape feeder 45, package 21, and the like after generating recipe data D10, host computer 16a may display a message to that effect on display device 40b (see FIG. 2). Thus, by checking the display of display device 40b, the producer can change the types of component manufacturers 13a to 13c and suction nozzles 43b to appropriate ones before starting the manufacturing of board Bd.

8. Generation of Recipe Data D10 in Another Example

The process of applying analyzed result data D2 to recipe data D10 is not limited to the above-described process content. For example, which of component manufacturers 13a to 13c is to be applied to in recipe data D10 may be determined by the selection of the producer. In the following description, the description of the same processing as that of FIG. 11 is omitted as appropriate.

Figure 12:
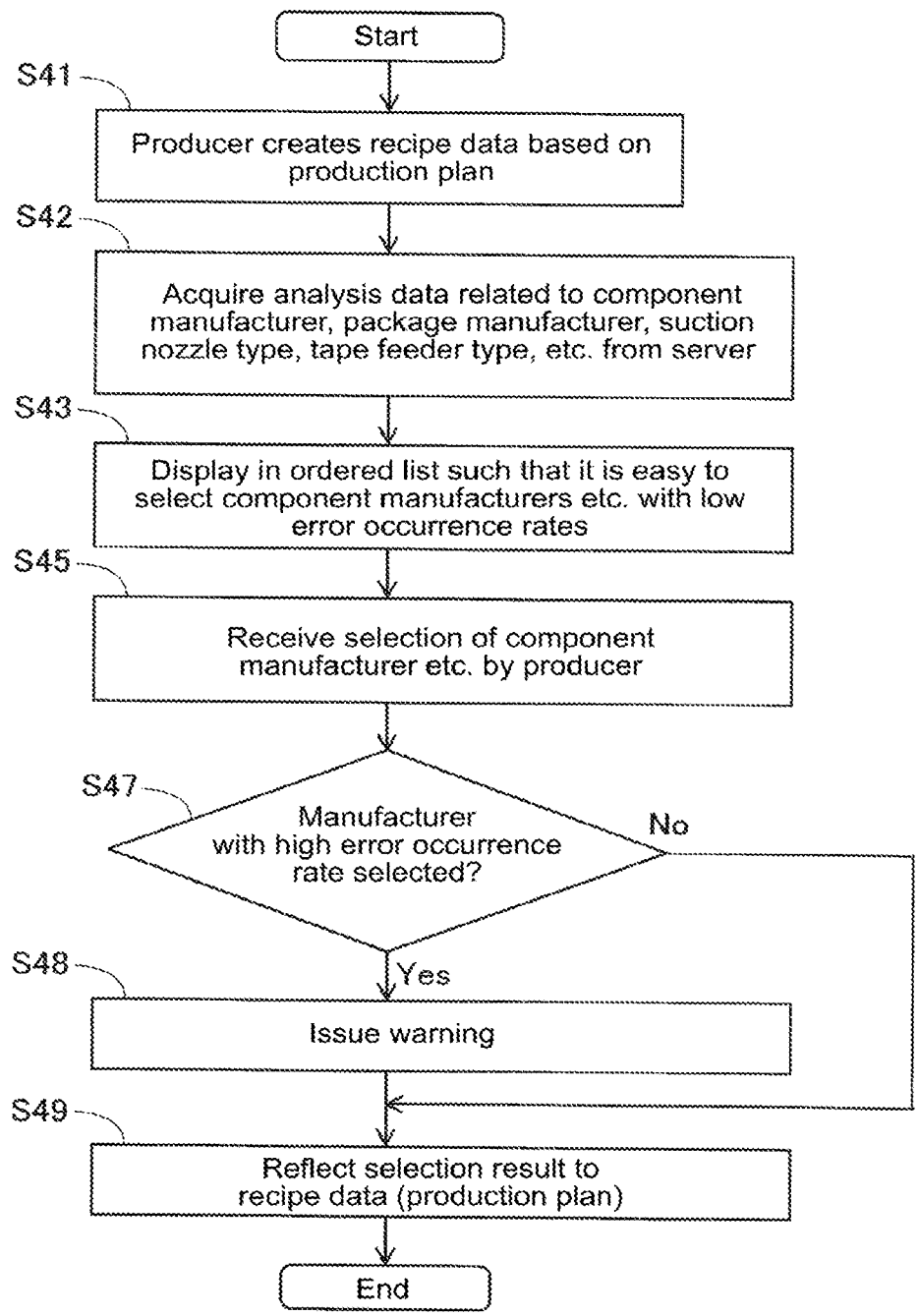
FIG. 12 is a flowchart illustrating details of processing of creating recipe data by a host computer in another example.

FIG. 12 illustrates the content of processing for generating recipe data D10 by host computer 16a according to another example. As illustrated in FIG. 12, first, the producer operates host computer 16a to create recipe data D10 of the board type to be produced based on job data D4 (production plan) (S41). When the producer inputs that recipe data D10 has been created, host computer 16a acquires analyzed result data D2 corresponding to the generated recipe data D10 from server 14a (S42).

Next, based on the obtained analyzed result data D2, host computer 16a displays on display device 40b (see FIG. 2) the types of component manufacturers 13a to 13c and package manufacturers 12a to 12c of electronic component 22 that can be used in recipe data D10, the types of suction nozzles 43b, the types of tape feeders 45, and the like (S43). At this time, if multiple component manufacturers 13a to 13c and the like can be selected, host computer 16a causes component manufacturers 13a to 13c and the like having a low error occurrence rate to be easily selected, for example, to be displayed at the top of the list, and causes the remaining components to be displayed in ascending order of the error occurrence rate. This makes it easier for the producer to select component manufacturers 13a to 13c or the like having a low error occurrence rate, thereby making it possible to more reliably improve the error occurrence rate. Host computer 16a may display multiple component manufacturers 13a to 13c in descending order of the error occurrence rate.

Next, host computer 16a receives a selection of the type or the like of component manufacturers 13a to 13c to be set in recipe data D10 from the producer (S45). When the selection of component manufacturers 13a to 13c or the like necessary for the generation of recipe data D10 is accepted (S45), host computer 16a determines whether the selected component manufacturers 13a to 13c or the like have a high error occurrence rate (S47). For example, host computer 16a determines whether the error occurrence rate is equal to or higher than a preset reference value (S47).

When there is an error having a high occurrence rate (S47: YES), host computer 16a notifies the producer of a warning (S48). Host computer 16a displays, for example, the selected component manufacturers 13a to 13c having a high error rate on display device 40b, and prompts the producer with a warning (S48). As a result, it is possible to reliably notify the producer that component manufacturers 13a to 13c and the like having a high error occurrence rate have been selected. The producer can take appropriate actions, such as creating recipe data D10 again, if erroneously selected.

After executing the warning in S48, host computer 16a executes S49. When component manufacturers 13a to 13c having a high error occurrence rate are not selected in S47 (S47: NO), host computer 16a executes S49. In S49, host computer 16a applies the types and the like of component manufacturers 13a to 13c based on the selection result by the producer to recipe data D10. As a result, the result of selection by the producer is applied to recipe data D10. For example, even if the producer wants to use component manufacturers 13a to 13c or the like having a high error occurrence rate from the viewpoint of manufacturing cost or the like, the intention to use can be applied to recipe data D10.

9. Effects of Configuration of Embodiments

Service system 10 of the embodiment described above includes host computers 16a to 16c (first data processing sections) provided in production bases 11a to 11c (first production bases), host computers 16a to 16c (second data processing sections) provided in production bases 11a to 11c (second production bases) different from production bases 11a to 11c, and server 14a connected to host computers 16a to 16c (first data processing sections and second data processing sections). Each of production bases 11a to 11c (first production base and second production base) is provided with a component mounter 33 for mounting electronic component 22 to board Bd. Component mounter 33 includes tape feeder 45 (supply device) for supplying electronic component 22 from package 21 (accommodation member) accommodating electronic component 22, and performs a mounting work for mounting electronic component 22 supplied from tape feeder 45 onto board Bd. Server 14a acquires operation information D1 of component mounter 33 in the mounting work from host computers 16a to 16c (first data processing section), generates analyzed result data D2 in which operation information D1 is analyzed based on the type of at least one of electronic component 22 and package 21 (component manufacturers 13a to 13c and package manufacturers 12a to 12c), and transmits the generated analyzed result data D2 to host computers 16a to 16c (second data processing section).

According to this, server 14a provides analyzed result data D2 generated from operation information D1 acquired from the first production base (for example, production base 11a) to host computer 16b (second data processing section) of the second production base (for example, production base 11b) which is another production base. analyzed result data D2 is data obtained by analyzing operation information D1 based on the type of the manufacturer of electronic component 22 and package 21 (accommodation member). As a result, host computer 16b of production base 11b can notify the producer (operator, production planner, and the like), of electronic component 22 and package 21 (component manufacturers 13a to 13c and package manufacturers 12a to 12c) which can further increase the operation rate of component mounter 33 in the mounting work, based on the information (analyzed result data D2) of the other production base (production base 11a).

Further, host computers 16a to 16c (second data processing sections) execute an inquiry to server 14a (S32 in FIG. 11) in response to starting the mounting work of producing a new type of board Bd by component mounter 33 provided in production bases 11a to 11c (second production bases). Server 14a transmits analyzed result data D2 to host computers 16a to 16c (second data processing sections) in response to an inquiry from host computers 16a to 16c (second data processing sections).

According to this, the second data processing section, for example, host computer 16b, when newly producing another type of board Bd, can select electronic component 22 or the like that can be used for the production of the next board Bd by inquiring server 14a and acquiring analyzed result data D2. As a result, the production efficiency of the next board Bd can be improved.

Further, server 14a acquires, as operation information D1, error information D11 relating to an error in which electronic component 22 cannot be acquired from tape feeder 45 (supply device) in the mounting work, from host computers 16a to 16c (first data processing section), and calculates an error occurrence rate for each manufacturer of at least one of electronic component 22 and package 21 (accommodation member) as analyzed result data D2.

According to this, host computer 16b (second data processing section) of the second production base (for example, production base 11b) can select electronic component 22 or package 21 (manufacturer) having a low error occurrence rate based on analyzed result data D2 of the first production base (for example, production base 11a).

Further, when the error occurrence rate is improved by changing at least one of the setting data (recipe data D10, etc.) of component mounter 33 in which the error has occurred and the mounting member (suction nozzle 43b or mounting head 43a) mounted on component mounter 33 after the occurrence of the error in which electronic component 22 cannot be acquired from tape feeder 45 (supply device) in the mounting work, host computers 16a to 16c (first data processing section) transmit countermeasure information D12 in which the setting data and the mounting member are changed and the manufacturer of electronic component 22 and package 21 (accommodation member) are associated with each other to server 14a.

When an error occurs in which electronic component 22 cannot be acquired, for example, the operator of component mounter 33 performs correspondence of changing the setting data (recipe data D10 or the like) of component mounter 33 or the mounting member (suction nozzle 43b or the like) mounted on component mounter 33. The error occurrence rate may be improved by the content of this correspondence. Therefore, server 14a acquires countermeasure information D12 having a history of improving the error occurrence rate from host computers 16a to 16c (first data processing section). Thereby, server 14a can provide countermeasure information D12 (setting data or the like) capable of improving the error occurrence rate when the mounting work using electronic components 22 or packages 21 of the same type of manufacturers is performed in the different production bases 11a to 11c and a similar error occurs.

Further, host computers 16a to 16c (second data processing section) acquire the error occurrence rate from server 14a as analyzed result data D2, and select a manufacturer with a lower error occurrence rate as a manufacturer of at least one of electronic component 22 and package 21 (accommodation member) used for the mounting work (S33 in FIG. 11).

According to this, since the electronic component 22 and package 21 (accommodation members) of the manufacturers having a low error occurrence rate are selected, it is possible to increase the operation rate in the other production bases 11a to 11c (second production bases).

Further, host computers 16a to 16c (second data processing section) acquire the error occurrence rate from server 14a as analyzed result data D2, and sort and display the manufacturers of at least one of electronic component 22 and package 21 (accommodation member) that can be used for the mounting work in the ascending order or the descending order of the error occurrence rate (S43 in FIG. 12).

According to this, by displaying the manufacturers of electronic component 22 and package 21 (accommodation member) in the ascending or descending order of the error occurrence rate, the producer can select a desired manufacturer (component manufacturers 13a to 13c and package manufacturers 12a to 12c) from the displayed contents in consideration of the manufacturing cost or the like.

Server 14a notifies the corresponding manufacturer of analyzed result data D2 (S24 in FIG. 9).

According to this, the manufacturers (component manufacturers 13a to 13c and package manufacturers 12a to 12c) who have received the notification can improve the quality of the product (electronic component 22 and package 21) by checking the content of analyzed result data D2. As a result, the quality of products on the market is improved, so that not only production bases 11a to 11c that receive the service but also the production bases that do not receive the service are provided with high-quality electronic components 22 and packages 21. As a result, the development of related industries can be promoted.

Further, production bases 11a to 11c (first production bases) are provided with host computers 16a to 16c (first host computers) that control a component mounter 33 of production bases 11a to 11c (first production bases) and have a first data processing section. Production bases 11a to 11c (second production bases) are provided with host computers 16a to 16c (second host computers) that control a component mounter 33 of production bases 11a to 11c (second production bases) and have a second data processing section. Server 14a is connected to each of host computers 16a to 16c (first host computer and second host computer) via wide area network 38.

According to this, server 14a can transmit and receive operation information D1 and analyzed result data D2 to and from host computers 16a to 16c of production bases 11a to 11c via wide area network 38, thereby improving the operation rate of production bases 11a to 11c.

10. Variations of Embodiment)

In the above embodiment, the accommodation member accommodating electronic component 22 is not limited to package 21, and may be a tray, for example. That is, component mounter 33 may include a tray-type supply device instead of tape feeder 45 as a supply device for supplying electronic components 22. In the tray-type supply device, the error occurrence rate of the suction error by suction nozzle 43b differs due to the warp of the tray, the error in pitch between electronic components 22 disposed in the tray, and the like. For this reason, even in the tray-type supply device, it is extremely effective to provide analyzed result data D2 by calculating the error occurrence rate or the like for each manufacturer of the tray or manufacturer (manufacturer of the accommodation member) who arranges electronic components 22 in the tray.

In the above embodiment, component manufacturers 13a to 13c and package manufacturers 12a to 12c are used as the manufacturers of the present disclosure, but the present disclosure is not limited thereto. For example, the manufacturers of tape feeder 45 and suction nozzle 43b may be targeted as manufacturers. More specifically, the data of the manufacturers of tape feeder 45 and suction nozzle 43b may be recorded in job data D4, and analyzed result data D2 may be generated in addition to the data of these manufacturers. Furthermore, generated analyzed result data D2 may be provided to these manufacturers. As a result, for example, when an error (such as a suction pickup error) occurs frequently in tape feeder 45 or suction nozzle 43b manufactured by a specific manufacturer, it is extremely effective to provide the error occurrence rate as analyzed result data D2 by calculation or the like in the same manner as in the above-described tray-type supply device. In the above embodiment, server 14a analyzes operation information D1 based on the types of both component manufacturers 13a to 13c and package manufacturers 12a to 12c, but the present disclosure is not limited thereto. For example, server 14a may perform the analysis based on one type (for example, only the type of package manufacturers 12a to 12c).

In the above embodiment, host computers 16a to 16c are provided as the first and second data processing sections for transmitting operation information D1 to server 14a, but the present disclosure is not limited thereto. For example, component mounter 33 may directly transmit operation information D1 to server 14a. In this case, production base 11a may not include host computers 16a to 16c. The first and second data processing sections may be realized as a portion of the function of component mounter 33.

REFERENCE SIGNS LIST

10: Service systems
11a to 11c: Production bases (first and second production bases)
12a to 12c: Package manufacturers (manufacturers)
13a to 13c: Component manufacturers (manufacturers)
14a: Servers
16a to 16c: Host computers (first and second data processing sections)
21: Package (accommodation member)
22: Electronic components
33: Component mounter
38: Wide area network
43a: Mounting head (mounting member)
43b: suction nozzle (mounting member)
45: Tape feeder (supply device)
Bd: Board
D1: Operation information
D2: Analyzed result data
D10: Recipe data (setting data)
D11: Error information
D12: Countermeasure information.

The invention claimed is:

1. A service system comprising:
a first data processing circuit provided in a first production base to control multiple production lines;
a second data processing circuit provided in a second production base located differently from the first production base to control multiple productions lines; and
a server connected to the first data processing circuit and the second data processing circuit,
wherein at least one component mounter configured to mount an electronic component on a board is provided in each of the first production base and the second production base,
wherein
the component mounter includes a supply device configured to supply the electronic component from an accommodation member in which electronic components are accommodated, and is configured to perform mounting work of mounting the electronic component supplied from the supply device on the board, and
the server is configured to acquire operation information of the component mounter, being obtained in the mounting work, from the first data processing circuit, generate analyzed result data obtained by analyzing the operation information based on a type of a manufacturer of at least one of the electronic components and the accommodation member, and transmit the generated analyzed result data to the second data processing circuit.

2. The service system according to claim 1, wherein
the second data processing circuit is configured to perform an inquiry to the server in response to a start of the mounting work of producing a new type of the board by the component mounter provided in the second production base, and
the server is configured to transmit the analyzed result data to the second data processing circuit in response to the inquiry from the second data processing circuit.

3. The service system according to claim 1, wherein
the server is configured to acquire, as the operation information, error information regarding an error in which it is not possible to acquire the electronic component from the supply device in the mounting work, from the first data processing circuit, and calculate, as the analyzed result data, an error occurrence rate for each manufacturer of at least one of the electronic component and the accommodation member.

4. The service system according to claim 3, wherein,
in a case where the error in which it is not possible to acquire the electronic component from the supply device in the mounting work occurs, and then the error occurrence rate is improved by changing at least one of setting data of the component mounter in which the error has occurred and a mounting member mounted on the component mounter, the first data processing circuit is configured to transmit to the server, countermeasure information obtained by associating details of the change of the setting data and the mounting member with manufacturers of the electronic component and the accommodation member.

5. The service system according to claim 3, wherein
the second data processing circuit is configured to acquire the error occurrence rate from the server as the analyzed result data, and select a manufacturer in which the error occurrence rate is lower, as a manufacturer of at least one of the electronic component and the accommodation member used in the mounting work.

6. The service system according to claim 3, wherein
the second data processing circuit is configured to acquire the error occurrence rate from the server as the analyzed result data, and sort and
display manufacturers of at least one of the electronic component and the accommodation member usable in the mounting work in an ascending order or a descending order of the error occurrence rate.

7. The service system according to claim 1, wherein
the server notifies the corresponding manufacturer of the analyzed result data.

8. The service system according to claim 1, wherein
a first host computer configured to control the component mounter in the first production base and to include the first data processing circuit is provided in the first production base,
a second host computer configured to control the component mounter of the second production base and to include the second data processing circuit is provided in the second production base, and
the server is connected to each of the first host computer and the second host computer via a wide area network.

9. A server connected to a first data processing circuit provided in a first production base and a second data processing circuit provided in a second production base located differently from the first production base, the first data processing circuit controlling multiple production lines in the first production base and the second data processing circuit controlling multiple production lines in the second production base,
wherein a component mounter configured to mount an electronic component on a board is provided in each of the first production base and the second production base,
the component mounter includes a supply device configured to supply the electronic component from an accommodation member in which electronic components are accommodated, and performs a mounting work of mounting the electronic component supplied from the supply device on the board is performed, and
wherein the server comprises circuitry configured to acquire operation information of the component mounter, being obtained in the mounting work, from the first data processing circuit, generate analyzed result data obtained by analyzing the operation information based on a type of a manufacturer of at least one of the electronic components and the accommodation member, and transmit the generated analyzed result data to the second data processing circuit.

* * * * *